United States Patent
Kijima et al.

(10) Patent No.: US 10,115,887 B2
(45) Date of Patent: Oct. 30, 2018

(54) FERROELECTRIC CERAMICS AND METHOD FOR MANUFACTURING THE SAME

(71) Applicant: ADVANCED MATERIAL TECHNOLOGIES, INC., Chiba (JP)

(72) Inventors: Takeshi Kijima, Chiba (JP); Yuuji Honda, Chiba (JP); Yukinori Tani, Chiba (JP)

(73) Assignee: ADVANCED MATERIAL TECHNOLOGIES, INC., Chiba (JP)

( * ) Notice: Subject to any disclaimer, the term of this patent is extended or adjusted under 35 U.S.C. 154(b) by 540 days.

(21) Appl. No.: 14/543,024

(22) Filed: Nov. 17, 2014

(65) Prior Publication Data

US 2015/0147587 A1 May 28, 2015

(30) Foreign Application Priority Data

Nov. 19, 2013 (JP) .................. 2013-238994

(51) Int. Cl.
  *C04B 35/491* (2006.01)
  *H01L 41/187* (2006.01)
  (Continued)

(52) U.S. Cl.
  CPC ........ *H01L 41/1876* (2013.01); *C04B 35/491* (2013.01); *H01L 41/0815* (2013.01);
  (Continued)

(58) Field of Classification Search
  None
  See application file for complete search history.

(56) References Cited

U.S. PATENT DOCUMENTS 9,887,348 B2 * 2/2018 Kijima ................ H01L 41/0815
2002/0015852 A1 * 2/2002 Noguchi ................ C30B 23/02
                                                428/469

(Continued)

FOREIGN PATENT DOCUMENTS

| JP | 2004-235599 | 8/2004 |
| JP | 2013-168530 | 8/2013 |
| WO | 2006/087777 | 8/2006 |

OTHER PUBLICATIONS

Horita et al., "Material Properties of Heteroepitaxial Ir and Pb(ZrxTi1-x)O3Films on (100)(ZrO2)1-x(Y2O3)x/(100)Si Structure Prepared by Sputtering", Japanese Journal of Applied Physics, vol. 37, Part 1, No. 9B, pp. 5141-5144.*

(Continued)

*Primary Examiner* — Jonathan C Langman
(74) *Attorney, Agent, or Firm* — Wenderoth, Lind & Ponack, L.L.P.

(57) ABSTRACT

An aspect of the present invention relates to ferroelectric ceramics including a stacked film formed on a Si substrate, a Pt film formed on the stacked film, a SrTiO$_3$ film formed on the Pt film, and a PZT film formed on the SrTiO$_3$, wherein the stacked film is formed by repeating sequentially N times a first ZrO$_2$ film and a Y$_2$O$_3$ film, and a second ZrO$_2$ film is formed on the film formed repeatedly N times, the N being an integer of 1 or more. It is preferable that a ratio of Y/(Zr+Y) of the stacked film is 30% or less.

18 Claims, 5 Drawing Sheets

(51) Int. Cl.
  *H01L 41/319*   (2013.01)
  *H01L 41/08*    (2006.01)
  *H01L 41/318*   (2013.01)

(52) U.S. Cl.
  CPC ...... *H01L 41/319* (2013.01); *C04B 2235/787* (2013.01); *H01L 41/318* (2013.01); *Y10T 428/12549* (2015.01)

(56) References Cited

U.S. PATENT DOCUMENTS

| | | | |
|---|---|---|---|
| 2015/0183190 A1* | 7/2015 | Kijima | H01L 41/1876 378/78 |
| 2017/0162779 A1* | 6/2017 | Xiong | H01L 41/1876 |
| 2017/0170384 A1* | 6/2017 | Kijima | H01L 41/316 |
| 2017/0179367 A1* | 6/2017 | Kijima | H01L 41/081 |

OTHER PUBLICATIONS

English translation of Kazuya et al. (JP2013-168530), provided by the espace.net website, internet retrieval date of Jun. 12, 2017.*
English translation of Atsushi et al. (JP2004-235599) provided by the espace.net website, internet retrieval date of Jun. 12, 2017.*
Kim et al. "Biological Element Detection Sensor Application of Micromachined PZT Thick Film Cantilever", Proceedings of IEEE Sensors, 2003, pp. 1054-1058.*
Shim et al., "Atomic Layer Deposition of Yttria-Stabilized Zirconia for Solid Oxide Fuel Cells", Chem. Mater. 2007, 19, 3850-3854.*

* cited by examiner

FERROELECTRIC CERAMICS AND METHOD FOR MANUFACTURING THE SAME

BACKGROUND OF THE INVENTION

Field of the Invention

The present invention relates to ferroelectric ceramics, a PZT film and a manufacturing method thereof, and a manufacturing method of ferroelectric ceramics.

Description of a Related Art

A conventional manufacturing method of $Pb(Zr,Ti)O_3$ (hereinafter, referred to as "PZT") perovskite-type ferroelectric ceramics will be explained.

A $SiO_2$ film having a thickness of 300 nm is formed on a 4-inch Si wafer, and a $TiO_x$ film having a thickness of 5 nm is formed on the $SiO_2$ film. Next, for example, a Pt film having a thickness of 150 nm oriented in (111) is formed on the $TiO_x$ film, and a PZT sol-gel solution is applied onto the Pt film by using a spin coater. Spin conditions at this time are such that the wafer is rotated at a rotation rate of 1500 rpm for 30 seconds and is rotated at a rotation rate of 4000 rpm for 10 seconds.

Next, the applied PZT sol-gel solution is heated and held on a hot plate at 250° C. for 30 seconds to be dried, and moisture is removed, and then it is further heated and held on a hot plate maintained at a high temperature of 500° C. for 60 seconds to thereby be subjected to temporary calcination. A PZT amorphous film having a thickness of 150 nm is generated by repeating this several times.

Subsequently, the PZT amorphous film is subjected to an annealing treatment at 700° C. by using a pressurizing-type lamp annealing device (RTA: rapidly thermal anneal) to carry out PZT crystallization. The PZT film thus crystallized is constituted of a perovskite structure (for example, refer to Patent Literature 1).

[Patent Literature 1] WO 2006/087777

SUMMARY OF THE INVENTION

A PZT film having been formed on a substrate and crystalized has, as shown in FIG. 7, a crystal structure in which axis lengths of three axes are equal (a=b=c) and three angles formed by two axes are not equal ($\angle\alpha\neq\angle\beta\neq\angle\gamma$), and a c-axis is the longest axis. The PZT film has a crystal oriented in the c-axis direction (a crystal in which the c-axis is positioned in the perpendicular direction relative to the substrate surface) and a crystal oriented in the a-axis direction (a crystal in which the a-axis is positioned in the perpendicular direction relative to the substrate surface). When the PZT film is used as a piezoelectric element in which an electric field is applied in the direction perpendicular to the substrate surface in the PZT film to thereby be caused to move in the direction parallel to the substrate surface (hereinafter, referred to as a "piezoelectric element for extracting d31"), a smaller amount of the crystal oriented in the c-axis direction results in lowering properties of the piezoelectric element for extracting d31. In other words, a larger amount of the crystal oriented in the a-axis direction results in lowering properties of the piezoelectric element for extracting d31.

Note that "the direction perpendicular to the substrate surface" means including not only the direction completely perpendicular to the substrate surface but also direction that shifts by within 20 degrees from the direction completely perpendicular to the substrate surface. In addition, "the direction completely parallel to the substrate surface" means including not only the direction parallel to the substrate surface but also direction that shifts by within 20 degrees from the direction completely parallel to the substrate surface.

An aspect of the present invention is to enhance properties of a piezoelectric element for extracting d31 by increasing the amount of a crystal oriented in the c-axis direction in the PZT film.

Hereinafter, various aspects of the present invention will be explained.

[1] Ferroelectric ceramics including:
a Pt film formed on a $ZrO_2$ film;
a $SrTiO_3$ film formed on the Pt film; and
a PZT film formed on the $SrTiO_3$ film.

Note that, in the present description, a "PZT film" includes one containing an impurity in $Pb(Zr,Ti)O_3$, and various ones may be contained as long as a function of piezoelectric property of the PZT film is not extinguished even if the impurity is contained.

[2] Ferroelectric ceramics including:
a Pt film formed on a stacked film;
a $SrTiO_3$ film formed on the Pt film; and
a PZT film formed on the $SrTiO_3$ film, wherein,
the stacked film is a film formed by repeating N times sequentially a first $ZrO_2$ film and a $Y_2O_3$ film, and a second $ZrO_2$ film is formed on the film formed repeatedly N times; and
the N is an integer of 1 or more.

[3] The ferroelectric ceramics according to the above [2], wherein a ratio of Y/(Zr+Y) of the stacked film is 30% or less.

[4] Ferroelectric ceramics including:
an oxide film of a metallic crystal having a body-centered cubic lattice structure formed on a stacked film;
a Pt film formed on the oxide film; and
a PZT film formed on the Pt film, wherein,
the stacked film is a film formed by repeating N times sequentially a first $ZrO_2$ film and a $Y_2O_3$ film, and a second $ZrO_2$ film is formed on the film formed repeatedly N times;
the N is an integer of 1 or more; and
a ratio of Y/(Zr+Y) of the stacked film is 30% or less.

[5] Ferroelectric ceramics including:
an oxide film of a metallic crystal having a body-centered cubic lattice structure formed on a stacked film;
a Pt film formed on the oxide film;
a $SrTiO_3$ film formed on the Pt film; and
a PZT film formed on the $SrTiO_3$ film, wherein,
the stacked film is a film formed by repeating N times sequentially a first $ZrO_2$ film and a $Y_2O_3$ film, and a second $ZrO_2$ film is formed on the film formed repeatedly N times;
the N is an integer of 1 or more; and
a ratio of Y/(Zr+Y) of the stacked film is 30% or less.

[6] The ferroelectric ceramics according to the above [4] or [5], wherein a metallic crystal film having a body-centered cubic lattice structure is formed between the oxide film and the Pt film.

[7] The ferroelectric ceramics according to any one of the above [4] to [6], wherein the metallic crystal having a body-centered cubic lattice structure is a metallic crystal selected from the group consisting of lithium (Li), sodium (Na), potassium (K), titanium (Ti), vanadium (V), chromium (Cr), iron (Fe), rubidium (Rb), niobium (Nb), molybdenum (Mo), cesium (Cs), barium (Ba), tantalum (Ta), tungsten (W) and europium (Eu).

[8] The ferroelectric ceramics according to any one of the above [3] to [7], wherein a ratio of Y/(Zr+Y) of said stacked film is 5% or more and 25% or less.

[9] The ferroelectric ceramics according to any one of the above [2] to [8], wherein said stacked film has a first YSZ film formed between said first $ZrO_2$ film and said $Y_2O_3$ film, and a second YSZ film formed between said $Y_2O_3$ film and said second $ZrO_2$ film.

[10] The ferroelectric ceramics according to any one of the above [1] to [9], wherein:
said PZT film has a crystal oriented in a c-axis direction and a crystal oriented in an a-axis direction; and
a length of said a-axis satisfies a formula 1 below, 0.3975 nm<a-axis length<0.4002 nm　　　formula 1.

[11] The ferroelectric ceramics according to any one of the above [1] to [9], wherein 2θ of a (004) peak in a result of XRD of said PZT film satisfies a formula 2 below, 100.8032°<{2θ of (004)peak}<101.7489°　　　formula 2.

[12] The ferroelectric ceramics according to any one of the above [1] to [9], wherein a d value of a (004) peak in a result of XRD of the PZT film satisfies a formula 3 below, 0.9937<{d value of a (004)peak}<1.0005　　　formula 3.

In the present specification, a "d value" means the "d value" in the Bragg equation below, which means each plane distance obtained from peak positions appearing in each XRD.

Note that the Bragg equation means the condition introduced from the phenomenon in which, in X-ray diffraction, an X-ray is reflected by planes formed by atoms in a crystal (atomic net plane) and X-rays reflected by two parallel and different planes strengthen each other by interference. When denoting the distance between two planes by d, an angle formed between the X-ray and a flat plane by θ, an arbitrary integer by n and the wavelength of the X-ray by λ, the equation is indicated as $2d \cdot \sin \theta = n\lambda$.

This is referred to as the Bragg equation (condition).

[13] The ferroelectric ceramics according to any one of the above [1] to [12], wherein a (200) peak intensity and a (111) peak intensity in a result of XRD of said Pt film satisfy a formula 5 below, {Pt(200)peak intensity}≥100·{Pt(111)peak intensity}　　　formula 5.

[14] The ferroelectric ceramics according to any one of the above [1] to [12], wherein a (200) peak intensity and a (111) peak intensity in a result of XRD of said Pt film satisfy a formula 5' below, {Pt(200)peak intensity}≥50·{Pt(111)peak intensity}　　　formula 5'.

[15] The ferroelectric ceramics according to the above [1], wherein said $ZrO_2$ film is formed on a Si substrate.

[16] The ferroelectric ceramics according to the above [15], wherein each of said Si substrate, said $ZrO_2$ film and said Pt film is oriented in (100).

[17] The ferroelectric ceramics according to any one of the above [2] to [9], wherein said stacked film is formed on a Si substrate.

[18] The ferroelectric ceramics according to the above [2] or [3], wherein said stacked film is formed on a Si substrate, and each of said Si substrate, said stacked film and said Pt film is oriented in (100).

[19] The ferroelectric ceramics according to any one of the above [4] to [7], wherein said stacked film is formed on a Si substrate, and each of said Si substrate, said stacked film, said $TiO_2$ film and said Pt film is oriented in (100).

[20] A manufacturing method of ferroelectric ceramics, comprising:

a first step of forming sequentially a first $ZrO_2$ film and a $Y_2O_3$ film on a Si substrate;
a second step of forming a second $ZrO_2$ film on said $Y_2O_3$;
a third step of forming a Pt film on said second $ZrO_2$ film;
a fourth step of forming a $SrTiO_3$ film on said Pt film;
a fifth step of forming, on said $SrTiO_3$ film, a PZT amorphous film short of lead or a PZT amorphous film having a stoichiometric composition; and
a sixth step of forming, on said $SrTiO_3$ film, a PZT film obtained by crystallizing said PZT amorphous film by performing a heat treatment on said PZT amorphous film in a pressurized oxygen atmosphere.

[21] The manufacturing method of ferroelectric ceramics according to the above [20], wherein:
the method includes a step of repeating N times said first step between said first step and said second step; and
said N is an integer of 1 or more.

[22] The manufacturing method of ferroelectric ceramics according to the above [20] or [21], wherein a ratio of Y/(Zr+Y) in the whole of said first $ZrO_2$ film, said $Y_2O_3$ film and said second $ZrO_2$ film is 30% or less.

[23] The manufacturing method of ferroelectric ceramics according to the above [22], wherein a ratio of Y/(Zr+Y) in the whole of said first $ZrO_2$ film, said $Y_2O_3$ film and said second $ZrO_2$ film is 5% or more and 25% or less.

[24] The manufacturing method of ferroelectric ceramics according to any one of the above [20] to [23], comprising a step of forming an oxide film of a metallic crystal having a body-centered cubic lattice structure on said second $ZrO_2$ film, between said second step and said third step.

[25] The manufacturing method of ferroelectric ceramics according to the above [24], comprising a step of forming a metallic crystal film having a body-centered cubic lattice structure between said step of forming the oxide film of a metallic crystal and said third step.

[26] The manufacturing method of ferroelectric ceramics according to the above [24] or [25], wherein said metallic crystal having a body-centered cubic lattice structure is a metallic crystal selected from the group consisting of lithium (Li), sodium (Na), potassium (K), titanium (Ti), vanadium (V), chromium (Cr), iron (Fe), rubidium (Rb), niobium (Nb), molybdenum (Mo), cesium (Cs), barium (Ba), tantalum (Ta), tungsten (W) and europium (Eu).

[27] The manufacturing method of ferroelectric ceramics according to any one of the above [20] to [26], wherein an amount of lead in said PZT amorphous film short of lead is 80 atom % or more and 95 atom % or less when defining an amount of lead in a PZT amorphous film having a stoichiometric composition as 100 atom %.

[28] The manufacturing method of ferroelectric ceramics according to any one of the above [20] to [27], wherein a polling treatment is performed on said PZT film by forming plasma in a positon facing said PZT film, after forming said PZT film on said $SrTiO_3$ film.

[29] The manufacturing method of ferroelectric ceramics according to any one of the above [20] to [28], wherein:
said PZT film has a crystal oriented in a c-axis direction and a crystal oriented in an a-axis direction; and a length of said a-axis satisfies a formula 1 below, 0.3975 nm<a-axis length<0.4002 nm　　　formula 1

[30] The manufacturing method of ferroelectric ceramics according to any one of the above [20] to [28], wherein 2θ of a (004) peak in a result of XRD of said PZT film satisfies a formula 2 below, 100.8032°<{2θ of (004)peak}<101.7489°　　　formula 2.

[31] The manufacturing method of ferroelectric ceramics according to any one of the above [20] to [28], wherein a d value of a (004) peak in a result of XRD of said PZT film satisfies a formula 3 below, 0.9937<{d value of (004)peak}<1.0005    formula 3.

[32] The manufacturing method of ferroelectric ceramics according to any one of the above [20] to [31], wherein a (200) peak intensity and a (111) peak intensity in a result of XRD of said Pt film satisfy a formula 5 below, {Pt(200)peak intensity}≥100·{Pt(111)peak intensity}    formula 5.

[33] The manufacturing method of ferroelectric ceramics according to any one of the above [20] to [31], wherein a (200) peak intensity and a (111) peak intensity in a result of XRD of said Pt film satisfy a formula 5' below, {Pt(200)peak intensity}≥50·{Pt(111)peak intensity}    formula 5'.

Through applying one aspect of the present invention, properties of a piezoelectric element for extracting d31 can be enhanced by increasing the amount of a crystal oriented in the c-axis direction in a PZT film.

DESCRIPTION OF THE PREFERRED EMBODIMENTS

Hereinafter, embodiments and examples of the present invention will be explained in detail using the drawings. However, a person skilled in the art would be able to easily understand that the present invention is not limited to the following explanation but the configuration and details thereof can be changed variously without deviating from the gist and the scope of the present invention. Accordingly, the present invention should not be construed as being limited to the description of the present embodiments and Examples shown below.

(First Embodiment)

Figure 1:
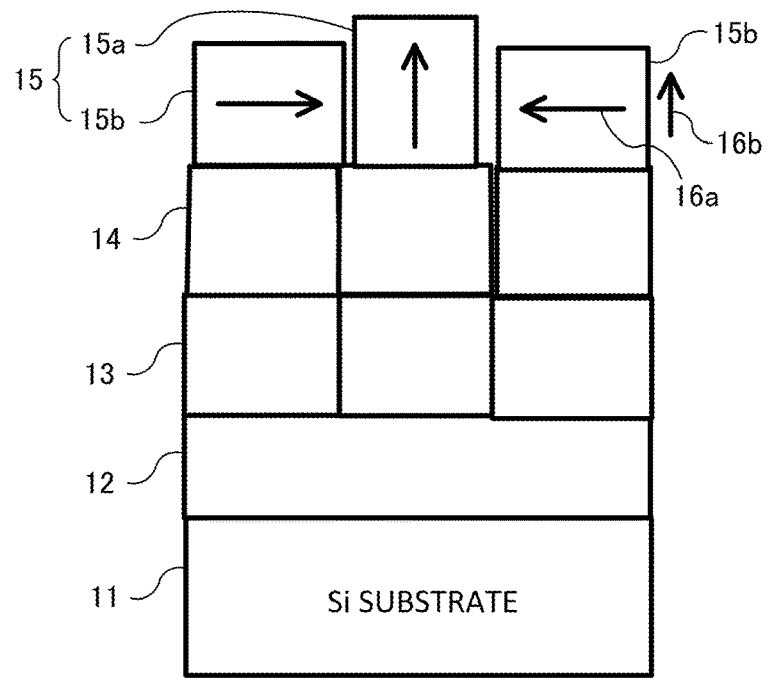
FIG. 1 is a schematic cross-sectional view explaining a manufacturing method of the ferroelectric ceramics according to an aspect of the present invention.
Figure 2:
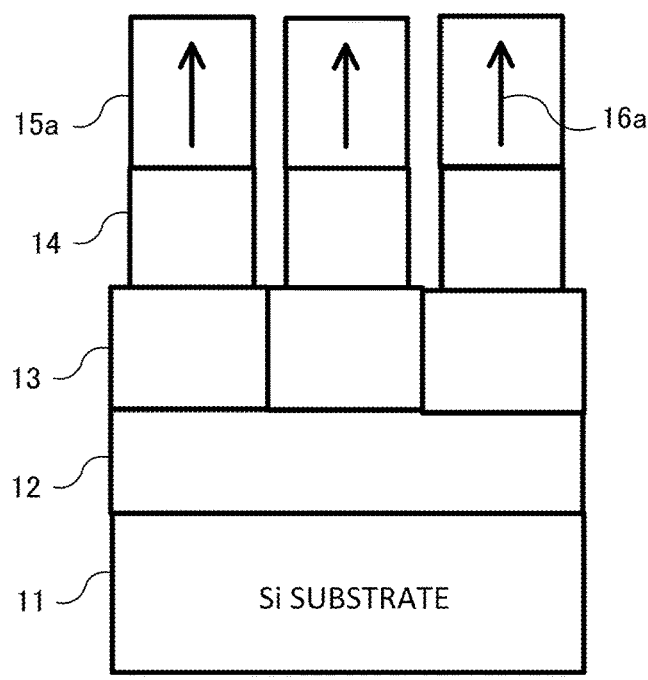
FIG. 2 is a schematic cross-sectional view explaining a manufacturing method of the ferroelectric ceramics according to an aspect of the present invention.

FIGS. 1 and 2 are schematic cross-sectional views explaining a manufacturing method of the ferroelectric ceramics according to a mode of the present invention. Each of a Pt film 13, a SrTiO$_3$ film 14 and a PZT film 15 shown in FIGS. 1 and 2 is shown schematically for every crystal.

As shown in FIG. 1, a stacked film 12 is formed on a Si substrate 11 having a (100) crystal plane. The stacked film 12 is a film, formed by repeating sequentially N times a first ZrO$_2$ film and a Y$_2$O$_3$ film and obtained by forming a second ZrO$_2$ film on the film formed repeatedly N times, N being an integer of 1 or more. The ratio of Y/(Zr+Y) of the stacked film 12 is preferably 30% or less (preferably 5% or more and 25% or less). Note that an oxide film such as a SiO$_2$ film or a TiO$_2$ film may be formed on the (100) crystal plane of the Si substrate 11. Furthermore, a Zr film may be formed between the Si substrate 11 and the stacked film 12.

Hereinafter, an example of a formation method of the first stacked film 12 will be explained in detail.

The Si substrate 11 is heated to 700° C. or more (preferably 800° C. or more), and the Si substrate 11 is set in a prescribed vacuum atmosphere. Subsequently, a Zr film is formed on the (100) crystal plane of the Si substrate 11 through an evaporation method by electron beams using an evaporation material of a Zr single crystal. It is desirable that the thickness of the Zr film is, for example, 0.2 nm to 30 nm, preferably 0.2 nm to 5 nm.

Subsequently, Zr is evaporated by an evaporation method by electron beams using an evaporation material of a Zr single crystal, and the evaporated Zr reacts with oxygen on the Zr film of the Si substrate 11 heated at 700° C. or more to thereby be formed into a ZrO$_2$ film, with the result that the film formation is performed. Then, Y is evaporated through an evaporation method by electron beams using an evaporation material of Y, and the evaporated Y reacts with oxygen on the ZrO$_2$ film of the Si substrate 11 heated at 700° C. or more to thereby be formed into a Y$_2$O$_3$ film. The formations of the ZrO$_2$ film and the Y$_2$O$_3$ film are repeated N times (N: an integer of 1 or more). After that, a ZrO$_2$ film is formed on the Y$_2$O$_3$ film by the same method as that described above. In this way, there is formed the stacked film 12 of a sandwich structure being vertically symmetric, in which the ZrO$_2$ film and the Y$_2$O$_3$ film are stacked and the Y$_2$O$_3$ film is vertically sandwiched between ZrO$_2$ films. Even when a YSZ film that is a very hard and brittle material having a Young's modulus of 522 GPa is formed by thermal diffusion in the joining portion of the ZrO$_2$ film and the Y$_2$O$_3$ film, a warp caused by the stress of the YSZ can be avoided by adopting the vertically symmetric sandwich structure. Note that the YSZ film will be described later.

In addition, the stacked film 12 is oriented in (100) in the same way as the (100) crystal plane of the Si substrate 11. It is preferable that the stacked film 12 has a film thickness of 2 nm to 100 nm (preferably 10 nm to 50 nm), and is a film having an extremely high single crystallinity.

Note that, in the present embodiment, the stacked film 12 is formed on the Si substrate 11, but the stacked film 12 is not limiting and a (100) orientation film other than the stacked film may be formed on the Si substrate 11. The (100) orientation film mentioned here means a film oriented in (100) in the same way as the (100) crystal plane of the Si substrate 11.

In the present embodiment, the stacked film 12 is formed on the Si substrate 11, but a ZrO$_2$ film may be formed in place of the stacked film 12.

Furthermore, in the present embodiment, the stacked film 12 is formed on the Si substrate 11, but an YSZ film may be formed on the Si substrate 11, in place of the stacked film 12. In this case, a Zr film is formed on the (100) crystal plane of the Si substrate 11 through an evaporation method by electron beams using an evaporation material of a Zr single crystal, and then by evaporating a Zr single crystal and Y through an evaporation method by electron beams using evaporation materials of a Zr single crystal and Y, materials obtained by evaporating the Zr single crystal and the Y react with oxygen on the Si substrate 11 heated at 700° C. or more to thereby become an oxide, and the YSZ film is formed on the Zr film. The YSZ film is oriented in (100) in the same way as the (100) crystal plane of the Si substrate 11. The YSZ film is a film having an extremely high single crystallinity. It is desirable that the thickness of the YSZ film is 2 nm to 100 nm (preferably 10 nm to 50 nm).

Note that, in the present specification, the "YSZ film" is referred to as a film in a stable state formed of a mixture of $Y_2O_3$ and $ZrO_2$ obtained by the oxidation of Y and Zr by oxygen, and also includes a film in which the stacked film obtained by stacking a $ZrO_2$ film and a $Y_2O_3$ film is changed into a mixture of $Y_2O_3$ and $ZrO_2$ by thermal diffusion. In a broad sense, the "YSZ film" is a substance in which several % of $Y_2O$ is mixed in $ZrO_2$ (in order to stabilize the oxidation number of Zr) and is a well-known substance in which 8% of $ZrO_2$ is added, or a substance obtained by oxidizing an alloy in which several % of Y is added to Zr and is also a well-known substance obtained by oxidizing an alloy in which 8% of Y is added to Zr.

After forming the above-described stacked film 12, a Pt film 13 by epitaxial growth is formed on the stacked film 12. The Pt film 13 is oriented in (100) in the same way as the stacked film 12. The Pt film 13 may function as an electrode film. Note that the Pt film 13 may be an electrode film other than a Pt film. The electrode film may be an electrode film constituted of, for example, an oxide or metal, or may be a Pt film or an Ir film.

Next, a $SrTiO_3$ film 14 is formed on the Pt film 13 by sputtering. Conditions of the sputtering film formation at this time are as follows.

Film formation pressure: 4 Pa
Film formation substrate temperature: ordinary temperature
Gas in film formation: Ar
Ar flow rate: 30 sccm
RF output: 300 W (13.56 MHz power source)
Film formation time: 6 minutes (thickness 50 nm)
Target: $SrTiO_3$ sintered body After that, the $SrTiO_3$ film 14 is crystallized by RTA (Rapid Thermal Anneal) under a pressurized oxygen atmosphere. Conditions of RTA at this time are as follows.

Annealing temperature: 600° C.
Introduced gas: oxygen gas
Pressure: 9 kg/cm$^2$
Temperature rising rate: 100° C./sec
Annealing time: 5 minutes The $SrTiO_3$ film 14 is formed of a complex oxide of strontium and titanium, and formed of a compound having a perovskite structure. Note that the crystal of $SrTiO_3$ has a die (cube)-like shape.

Subsequently, a PZT amorphous film short of lead, or a PZT amorphous film having a stoichiometric composition is formed on the $SrTiO_3$ film 14, and by subjecting the PZT amorphous film to a heat treatment in a pressurized oxygen atmosphere, the PZT film 15 obtained by crystallizing the PZT amorphous film is formed on the $SrTiO_3$ film 14. Note that it is preferable that the amount of lead in the PZT amorphous film short of lead is 80 atom % or more to 95 atom % or less, when the amount of lead in the case where a PZT amorphous film has a stoichiometric composition is defined as 100 atom.

Hereinafter, an example of formation method of the PZT film 15 will be explained in detail.

There was used, as a sol-gel solution for forming a PZT film, an E1 solution containing butanol as a solvent, being obtained by adding lead in an amount being short by 70% to 90% and having a concentration of 10% by weight.

An alkaline alcohol having an amino group, referred to as dimethylamino ethanol, was added to the sol-gel solution, at a ratio of E1 sol-gel solution:dimethylamino ethanol=7:3 in a volume ratio, which exhibited strong alkalinity of pH=12.

A PZT amorphous film was formed using the above-described solution by spin coating. MS-A200 manufactured by MIKASA Co., LTD. was used as a spin coater. First, the coater was rotated at 800 rpm for 5 seconds and at 1500 rpm for 10 seconds, and then the rotation rate was raised gradually to 3000 rpm in 10 seconds, which was allowed to stand on a hot plate (AHS-300, a ceramic hot plate manufactured by AS ONE Corporation) at 150° C. for 5 minutes in the air, and after that, was allowed to stand on a hot plate (AHS-300) at 300° C. for 10 minutes also in the air, and then was cooled to room temperature. A PZT amorphous film having an intended thickness of 200 nm was formed on the $SrTiO_3$ film 14 by repeating the process five times. The product was formed in plural number.

Then, the PZT film 15 obtained by crystallizing the above-described PZT amorphous film is formed on the $SrTiO_3$ film 14 by performing a heat treatment on the PZT amorphous film in a pressurized oxygen atmosphere.

The PZT film 15 has a crystal 15a oriented in a c-axis direction 16a and a crystal 15b oriented in an a-axis direction 16b. The axis length of the c-axis is longer than the axis length of the a-axis by approximately 6%. Furthermore, it is preferable that the a-axis length satisfy a formula 1 below. Thereby, the (004) peak of the PZT film 15 becomes intensive, and the amount or the ratio of the crystal 15a oriented in the c-axis direction 16a can be increased. Note that the numerical values in the formula 1 below are values obtained by experiments.

$$0.3975 \text{ nm} < \text{a-axis length} < 0.4002 \text{ nm} \quad \text{formula 1}$$

After forming the PZT film 15 as described above, plasma is formed in a position facing the PZT film 15 and thus the PZT film 15 subjected to a polling treatment. Thereby, as shown in FIG. 2, the amount of the (001) crystal 15a oriented in the c-axis direction 16a in the PZT film 15 can be increased.

When denoting the amount of the (001) crystal 15a oriented in the c-axis direction 16a in the PZT film 15 by C, and the amount of the (100) crystal 15b oriented in the a-axis direction 16b in the PZT film 15 by A, it is preferable that these satisfy the formula 4 below. Note that the numerical values in the formula 4 below are values obtained by experiments.

$$C/(A+C) \geq 0.1 \text{ (preferably, } C/(A+C) \geq 0.20, \text{ more preferably, } C/(A+C) \geq 0.25, \text{ further more preferably,} \\ C/(A+C) \geq 0.35) \quad \text{formula 4}$$

Note that, in the present specification, "oriented in the c-axis direction" means that the c-axis exists in the direction (orientation direction) perpendicular to the substrate surface (orientation plane), and "oriented in the a-axis direction" means that the a-axis exists in the direction (orientation direction) perpendicular to the substrate surface (orientation plane). The "perpendicular direction (orientation direction)" mentioned here means that it includes not only the direction completely perpendicular to the substrate surface (orientation plane) but also directions shifted by within 20° from the direction completely perpendicular to the substrate surface.

According to the present embodiment, since the $SrTiO_3$ film 14 having a lattice constant close to the axis length of the a-axis of PZT is disposed between the PZT film 15 and the Pt film 13, the amount or the ratio of the crystal 15a oriented in the c-axis direction 16a in the PZT film 15 can be increased. As the result, piezoelectric properties when the PZT film 15 is used as a piezoelectric element for extracting d31 can be enhanced.

It is considered that, since each thickness of the first stacked film 12, the Pt film 13 and the PZT film 15 is several tens nm to several μm but the thickness of the Si substrate 11 is as thick as approximately 500 μm and the lattice constant of Si is larger than the lattice constant of each of Pt and PZT, the Si substrate 11 may give an influence of widening the axis length of a Pt crystal in the direction parallel to the substrate surface of the Pt film 13. It is considered that the influence may increase the amount or the ratio of the (100) crystal 15b oriented in the a-axis direction 16b in the PZT film 15. The reason therefor is that, since the axis length of the c-axis is longer than the axis length of the a-axis by approximately 6%, formation of the (100) crystal 15b oriented in the a-axis direction 16b is more stable energetically than formation of the (001) crystal 15a oriented in the c-axis direction 16a.

In contrast, it is possible to give an influence contrary to the influence of widening the axis length of a Pt crystal (that is, to absorb the influence of widening the axis length of a Pt crystal) by the $SrTiO_3$ film 14 having a lattice constant close to the axis length of the PZT a-axis, and, as the result, the amount or the ratio of the crystal 15a oriented in the c-axis direction 16a in the PZT film 15 can be increased. The reason therefor is that $SrTiO_3$ is a crystal of the cubic system in which all axis lengths are equal, and even if the orientation direction is shifted, $SrTiO_3$ can give the above-described contrary influence.

Furthermore, according to the present embodiment, since a PZT amorphous film short of lead or a PZT amorphous film having a stoichiometric composition is used in forming the PZT film 15, the amount or the ratio of the crystal 15a oriented in the c-axis direction 16a in the PZT film 15 can be increased. The reason therefor is that, when a PZT amorphous film obtained by adding excess lead is used, PbO is formed in the PZT film in crystallization due to the excess lead and a crystal oriented in the a-axis direction is easily formed on the PbO, whereas the formation of PbO is suppressed in the crystallization by using a PZT amorphous film short of lead and thus the amount or the ratio of a crystal oriented in the a-axis direction can be lowered. For example, it is confirmed that, in contrast to denoting the amount of lead by 100 atom % in the case where a PZT amorphous film has a stoichiometric composition, the use of a PZT amorphous film in which the lead amount is 80 atom % results in approximately C/(A+C)=0.236.

Moreover, it is preferable that 2θ of the (004) peak in a result of XRD of the PZT film 15 satisfies a formula 2 below. Thereby, the amount or the ratio of the crystal 15a oriented in the c-axis direction 16a can be increased. Note that the values in the formula 2 below are values obtained by experiments.

$$100.8032° < \{2θ \text{ of } (004)\text{peak}\} < 101.7489° \qquad \text{formula 2}$$

In addition, it is preferable that the d value of the (004) peak in a result of XRD of the PZT film 15 satisfies a formula 3 below. Thereby, the (004) peak of the PZT film 15 becomes intensive, and the amount or the ratio of the crystal 15a oriented in the c-axis direction 16a can be increased. Note that the values in the formula 3 below are values obtained by experiments.

$$0.9937 < \{d \text{ value of } (004)\text{peak}\} < 1.0005 \qquad \text{formula 3}$$

Furthermore, it is preferable that a (200) peak intensity in a result of XRD of the Pt film 13 is 100 times or more (preferably 50 times or more) a (111) peak intensity, and that these satisfy a formula 5 below (preferably a formula 5' below).

$$\{Pt(200)\text{peak intensity}\} \geq 100 \cdot \{Pt(111)\text{peak intensity}\} \qquad \text{formula 5}$$

$$\{Pt(200)\text{peak intensity}\} \geq 50 \cdot \{Pt(111)\text{peak intensity}\} \qquad \text{formula 5'}$$

That is, the Pt film 13 may be preferentially oriented in (200) including (111). The reason why Pt may include (111) (it is preferable that the Pt includes (111)) is as follows. Since the PZT film 15 epitaxially grows while succeeding to the orientation of the Pt film, approximately 1/50 of the total PZT crystal becomes PZT (111) also in the PZT film. Since the polarization axis of PZT exists toward (001) direction, the polarization axis of a (111)-oriented component of PZT exists with an inclination of 45° relative to the surface of the Si substrate 11. In this case, as to piezoelectric properties, only a small piezoelectric performance corresponding to the inclination of 45° can be extracted, but when a polarization axis inclines, the polarization axis is reversed by a lower electric field accordingly. Additionally, since most of the component of 49/50 is PZT (001), the magnitude of piezoelectricity is determined depending on (001). Moreover, in a PZT film oriented in (001) while including (111) by approximately 1/50, the polarization axis can be reversed by a low electric field caused by the PZT (111) component, and large piezoelectric properties can be obtained by the PZT (001) component. Therefore, a PZT film that is reversed by a low voltage and gives large piezoelectric properties can be achieved by performing control so that Pt (100) and Pt (111) exist in a mixed state and an XRD intensity holds Pt (100)>Pt (111).

Note that, in the present embodiment, although the Si substrate 11 is used, a single crystalline substrate other than the Si substrate 11 may be used.

Note that the present embodiment may be carried out with a modification below.

<Modification>

The modification differs from the first embodiment in that a PTO film is formed between the $SrTiO_3$ film 14 and the PZT film 15 shown in FIG. 1, and other points are the same as the first embodiment. The PTO film is a lead titanate film, and the lead titanate has, for example, an axis length of the a-axis of 0.3904 nm and an axis length of the c-axis of 0.4043 nm.

Also in the present modification, the same effect as that of the first embodiment can be obtained.

Furthermore, in the present modification, since the PTO film formed between the $SrTiO_3$ film 14 and the PZT film 15 has an axis length that is close to the axis length of each of the a-axis and the c-axis of PZT, the amount or the ratio of the crystal 15a oriented in the c-axis direction 16a in the PZT film 15 can be increased. As the result, piezoelectric properties when the PZT film 15 is used as a piezoelectric element for extracting d31 can be enhanced.

(Second Embodiment)

Figure 3:
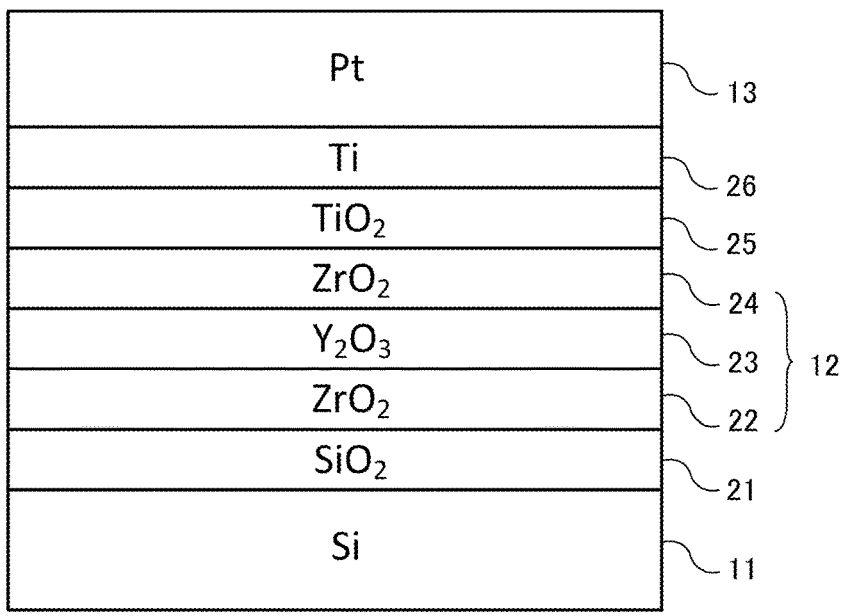
FIG. 3 is a schematic cross-sectional view explaining a manufacturing method of the ferroelectric ceramics according to an aspect of the present invention.

FIG. 3 is a schematic cross-sectional view for explaining a manufacturing method of the ferroelectric ceramics according to an aspect of the present invention, in which the same sign is given to the same portions as those in FIG. 1 and FIG. 2.

A $SiO_2$ film 21 being a natural oxide film is formed on a surface of a Si substrate 11 having a (100) crystal plane. Then, the stacked film 12 is formed on the $SiO_2$ film 21. The stacked film 12 is a film in which a first $ZrO_2$ film 22 and a $Y_2O_3$ film 23 are sequentially formed and a second $ZrO_2$ film 24 is formed on the Y$_2$O$_3$ film 23, and the stacked film 12 is formed in the same method as that in the first embodiment.

Next, an anatase-type TiO$_2$ film 25 is formed on the second ZrO$_2$ film 24 at low temperatures as an example of an oxide film of a metallic crystal having a body-centered cubic lattice structure. An example of film formation conditions at this time is as follows.

TiO$_2$ film 25 is formed by forming a Ti film by a DC sputtering method and then by subjecting the Ti film to a heat treatment in oxygen. Details are as follows.

<Film formation conditions of Ti film>
Film formation device: DC spattering device
Distance between target-substrate: 50 mm
Substrate temperature: 200° C.
Gas used in film formation: Atmosphere of 100% Ar gas
Sputtering pressure: 0.5 Pa
DC power supply: 200 W
Film formation time: 20 seconds (film thickness 2 nm)
<Heat treatment conditions of Ti film>
Oxygen pressure: 10 atoms
Substrate temperature: 400° C.
Treatment time: 1 min.

Note that the metallic crystal having a body-centered cubic lattice structure is preferably one metallic crystal selected from the group consisting of lithium (Li), sodium (Na), potassium (K), titanium (Ti), vanadium (V), chromium (Cr), iron (Fe), rubidium (Rb), niobium (Nb), molybdenum (Mo), cesium (Cs), barium (Ba), tantalum (Ta), tungsten (W) and europium (Eu).

Next, a Ti film 26 is formed on the TiO$_2$ film 25. Film formation conditions at this time are the same as conditions for forming a Ti film in forming the above-described TiO$_2$ film 25.

Next, the Pt film 13 by the same epitaxial growth as that in the first embodiment is formed on the Ti film 26. Subsequently, the same SrTiO$_3$ film and PZT film as those in the first embodiment may be sequentially formed on the Pt film 13, or the same PZT film as that in the first embodiment may be formed on the Pt film 13.

An example of conditions for forming the Pt film 13 is as follows.
Film formation device: DC spattering device
Distance between target and substrate: 50 mm
Substrate temperature: 400° C.
Gas used in film formation: Atmosphere of 100% Ar gas
Sputtering pressure: 1 Pa
DC power supply: 400 W
Film formation time: 240 seconds (film thickness 150)

The reason why the TiO$_2$ film 25 is formed on the second ZrO$_2$ film 24 in contact with it is that the junction state becomes good since Young's modulus of an anatase-type TiO$_2$ film formed at low temperatures is 205 GPa and Young's modulus of ZrO$_2$ is 200 GPa and hardness of both films approximately coincide with each other and Ti and Zr are metals compatible each other.

In addition, the reason why the Ti film 26 is formed on the TiO$_2$ film 25 in contact with it is that a metal and an oxide of the same metal exhibits good close adhesion.

Furthermore, the reason why the Pt film 13 is formed on the Ti film 26 in contact with it is that Ti and Pt make a good alloy and exhibit good close adhesion, and that the Pt film 13 positioned on the Ti film 26 has an effect of being easily oriented in (100) since the Ti film 26 has a body-centered cubic lattice structure.

Also in the present embodiment, the same effect as that of the first embodiment can be obtained.

Note that, in the present embodiment, the Ti film 26 is formed between the Pt film 13 and the TiO$_2$ film 25, but since the TiO$_2$ film 25 and the Pt film 13 exhibit good close adhesion, a configuration of forming the Pt film 13 on the TiO$_2$ film 25 without forming the Ti film 26 may also be adopted. That is, a configuration of forming the Pt film 13 on an oxide film of a metallic crystal having a body-centered cubic lattice structure may be adopted. Furthermore, there may be adopted a configuration of forming a metallic crystal film having a body-centered cubic lattice structure on an oxide film of a metallic crystal having a body-centered cubic lattice structure and forming the Pt film 13 on the metallic crystal film.

The present embodiment may be modified and executed as follows.

<Modification>

Figure 4:
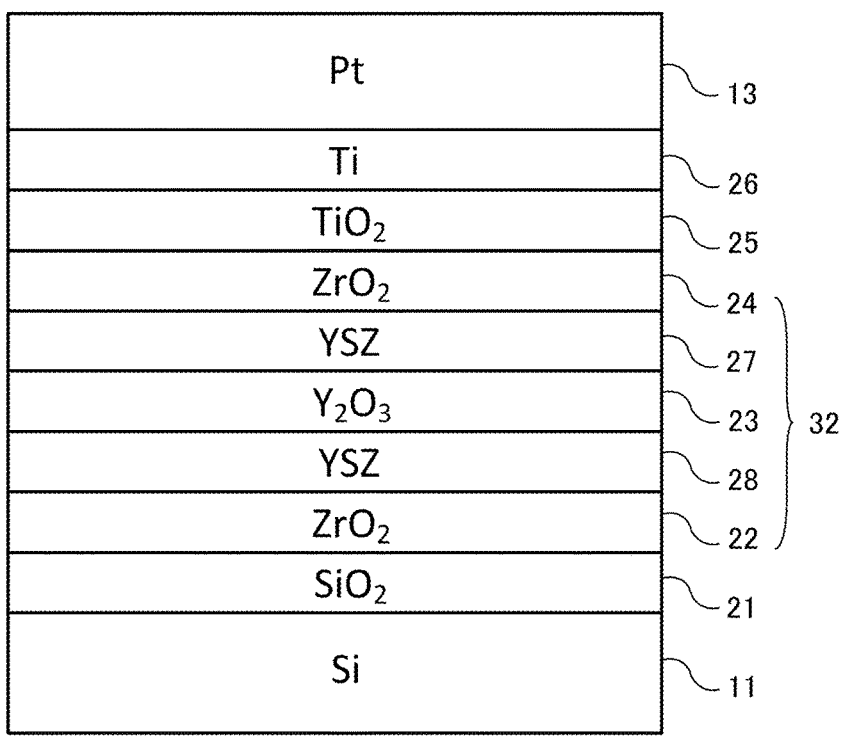
FIG. 4 is a cross-sectional view showing a modification of a second embodiment.

FIG. 4 is a cross-sectional view showing schematically the ferroelectric ceramics according to an aspect of the present invention, and is a drawing showing a modification of the second embodiment, in which the same sign is given to the same portion as that in FIG. 3 and only different portions will be explained.

In the ferroelectric ceramics shown in FIG. 4, a stacked film 32 is different from the stacked film 12 of the ferroelectric ceramics shown in FIG. 3, and other points are the same as the ferroelectric ceramics shown in FIG. 3.

The stacked film 32 has a first YSZ film 28 formed by thermal diffusion between the first ZrO$_2$ film 22 and the Y$_2$O$_3$ film 23, and a second YSZ film 27 formed by thermal diffusion between the Y$_2$O$_3$ film 23 and the second ZrO$_2$ film 24. Each of the first YSZ film 28 and the second YSZ film 27 has the Young's modulus of 522 GPa and is very hard and brittle. However, since the stacked film has been made into a vertically symmetric sandwich structure, a warp caused by the stress of the YSZ can be avoided.

Also in the present modification, the same effect as that of the second embodiment can be obtained.

Note that above-described embodiments may be appropriately combined and executed.

EXAMPLE

Figure 5:
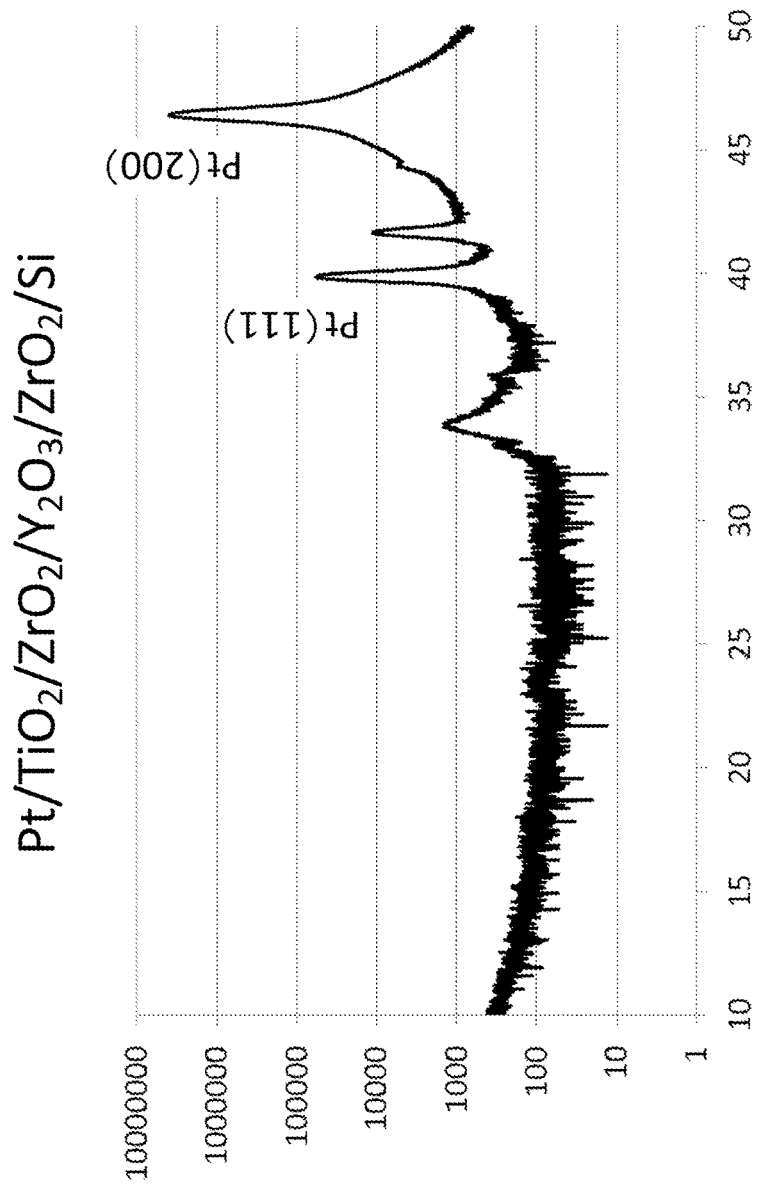
FIG. 5 is an XRD chart showing peaks of (111) and (200) of a Pt film according to Example.

FIG. 5 is an XRD chart showing peaks of (111) and (200) of a Pt film according to Example. In FIG. 5, the vertical axis shows an XRD reflection intensity and the horizontal axis shows a rotation angle 2θ.

A production method of a Pt film according to Example is as follows.

A natural oxidation film is attached to the surface of a Si substrate having a (100) crystal plane. A ZrO$_2$ film, a Y$_2$O$_3$ film, a ZrO$_2$ film and a TiO$_2$ film are sequentially formed on the Si substrate, a ZrO$_2$ film, and a Pt film is formed on the TiO$_2$ film. Hereinafter, formation methods of respective films will be explained in detail.

By irradiating a ZrO$_2$ target with electron beams for about 10 minutes, continuously irradiating a Y$_2$O$_3$ target with electron beams for 2 minutes and then continuously irradiating a ZrO$_2$ target with electron beams for about 10 minutes, a ZrO$_2$ film, a Y$_2$O$_3$ film and a ZrO$_2$ film are sequentially formed on the Si substrate on which a natural oxidation film exists by an evaporation method. Conditions at this time are as follows.
Vacuum degree in film formation: 2×10$^{-4}$ Pa
Substrate temperature: 800° C.
Substrate rotation rate: 15 rpm
Output: 60 kW Next, a TiO$_2$ film is formed on the ZrO$_2$ film. The TiO$_2$ film is formed by forming a Ti film by a DC sputtering method, and then by subjecting the Ti film to a heat treatment in oxygen. Details are as follows.

<Formation conditions of Ti film>
Film formation apparatus: DC sputtering apparatus
Distance between target and substrate: 50 mm
Substrate temperature: 200° C.
Gas in film formation: atmosphere of 100% Ar gas
Sputtering pressure: 0.5 Pa
DC power: 200 W
Film formation time: 20 seconds (thickness 2 nm)
<Heat treatment conditions of Ti film>
Oxygen pressure: 10 atoms
Substrate temperature: 400° C.
Treatment time: 1 minute Next, a Pt film is formed on the TiO$_2$ film by a DC sputtering method. Film formation conditions at this time are as follows.

Film formation apparatus: DC sputtering apparatus
Distance between target and substrate: 50 mm
Substrate temperature: 400° C.
Gas in film formation: atmosphere of 100% Ar gas
Sputtering pressure: 1 Pa
DC power: 400 W
Film formation time: 240 seconds (thickness 150 nm)

The Pt electrode-covered Si substrate thus produced was 150 nm-Pt/2 nm-TiO$_2$/15 nm-ZrO$_2$/3 nm-Y$_2$O$_3$/15 nm-ZrO$_2$/Si substrate. The XRD pattern at this time was as shown in FIG. 5.

From FIG. 5, the following ratios can be derived.

{Pt(111)peak intensity}/{Pt(200)peak intensity}=57266/3866208=0.0148≈1.5%

{Pt(111)peak intensity}:{Pt(200)peak intensity}=1:67

From the above, it can be said that the (200) peak intensity of the Pt film is 50 times or more the (111) peak intensity.

Figure 6:
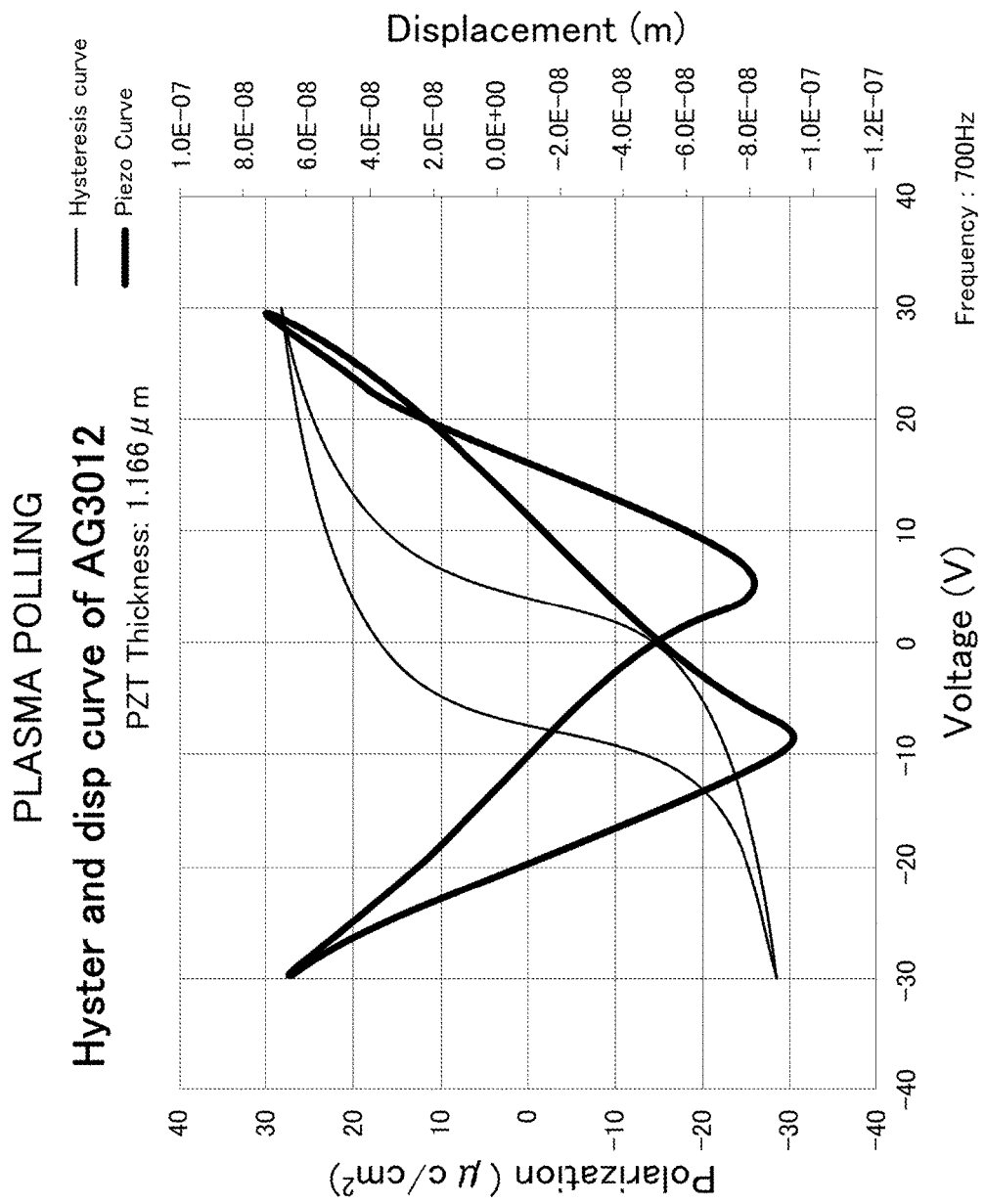
FIG. 6 is a drawing showing a result of evaluating hysteresis of a PZT film according to Example and a piezo curve of the PZT film.
Figure 7:
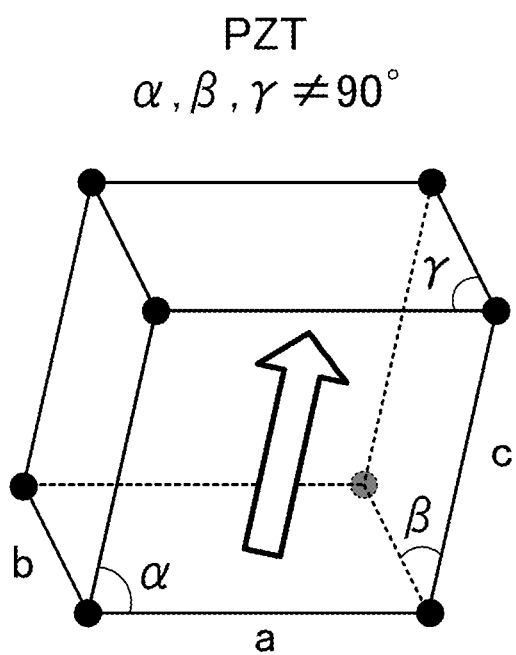
FIG. 7 is a schematic view showing a crystal structure of PZT.

FIG. 6 is a drawing showing a result of evaluating hysteresis of the PZT film according to Example (vertical axis: residual polarization Pr (μC/cm$^2$), horizontal axis: applied voltage Vc(V)), and a piezo curve of the PZT film.

The production method of the PZT film according to Example in FIG. 6 is as follows.

In the same way as the production method of the Pt film according to Example in FIG. 5, a ZrO$_2$ film, a Y$_2$O$_3$ film, a ZrO$_2$ film, a TiO$_2$ film and a Pt film are sequentially formed on a Si substrate having a (100) crystal plane to which a natural oxidation film is attached. Subsequently, a PZT film is formed on the Pt film as follows.

There was used, as a sol-gel solution for forming the PZT film, an E1 solution obtained by adding lead in an amount of a stoichiometric composition free from shortage of lead and having a concentration of 10% by weight, in a butanol solvent.

An alkaline alcohol having an amino group, referred to as dimethylamino ethanol, was added to the sol-gel solution, at a ratio of E1 sol-gel solution:dimethylamino ethanol=7:3 in a volume ratio, which exhibited strong alkalinity of pH=12.

A PZT amorphous film was formed using the above-described solution by spin coating. MS-A200 manufactured by MIKASA CO., LTD. was used as a spin coater. First, the coater was rotated at 800 rpm for 5 seconds and at 1500 rpm for 10 seconds, and then the rotation rate was raised gradually to 3000 rpm in 10 seconds, which was allowed to stand on a hot plate (AHS-300, a ceramic hot plate manufactured by AS ONE Corporation) at 150° C. for 5 minutes in the air, and after that, was allowed to stand on a hot plate (AHS-300) at 300° C. for 10 minutes also in the air, and then was cooled to room temperature. A PZT amorphous film having an intended thickness of 200 nm was formed on the substrate by repeating the process five times. The product was formed in plural number.

Then, a PZT film obtained by crystallizing the above-described PZT amorphous film was produced on the substrate by performing a heat treatment on the PZT amorphous film in a pressurized oxygen atmosphere.

The PZT film was subjected to a plasma polling treatment by forming plasma in a position facing the PZT film produced as described above. Conditions at this time were as follows.

RF power source: 380 kHz and 13.56 MHz
Pressure: 1 to 30 Pa
RF output: 70 to 700 w
Ar gas: 15 to 30 sccm
Temperature: 25° C.
Treatment time: 1 minute
Vdc per 1 μm of PZT film thickness=50 v As shown in FIG. 6, it was confirmed that the PZT film subjected to a plasma polling treatment gave excellent piezoelectric properties when the PZT film was used as a piezoelectric element for extracting d31. As the reason why excellent piezoelectric properties are obtained, the following three reasons are considered.

(1) Since the Pt film is preferentially oriented in (200) including (111), the PZT film epitaxially grows while succeeding to the orientation of the Pt film, approximately ⅛ of the total PZT crystal becomes PZT (111) also in the PZT film. Since the polarization axis of PZT exists toward (001) direction, the polarization axis of a (111)-oriented component of PZT exists with an inclination of 45° relative to the surface of the Si substrate. In this case, as to piezoelectric properties, only a small piezoelectric performance corresponding to the inclination of 45° can be extracted, but when a polarization axis inclines, the polarization axis is reversed by a lower electric field accordingly. Additionally, since most of the component of ⅞ is PZT (001), the magnitude of piezoelectricity is determined depending on (001). Accordingly, in a PZT film oriented in (001) while including (111) by approximately ⅛, the polarization axis can be reversed by a low electric field caused by the PZT (111) component, and large piezoelectric properties can be obtained by the PZT (001) component. Therefore, it is considered that excellent piezoelectric properties can be obtained.

(2) It is considered that, since the ratio of Y/(Zr+Y) in the whole of the ZrO$_2$ film, the Y$_2$O$_3$ film and the ZrO$_2$ film is 5% or more and 25% or less, excellent piezoelectric properties can be obtained.

(3) A vertically symmetric sandwich structure obtained by vertically sandwiching the Y$_2$O$_3$ film between the ZrO$_2$ films is formed by forming the ZrO$_2$ film, the Y$_2$O$_3$ film and the ZrO$_2$ film in this order, and thus, even when a YSZ film that is a very hard and brittle material having a Young's modulus of 522 GPa is formed by thermal diffusion in the joining portion of the ZrO$_2$ film and the Y$_2$O$_3$ film, a warp caused by the stress of the YSZ film can be avoided. Accordingly, it is considered that excellent piezoelectric properties can be obtained.

DESCRIPTION OF REFERENCE SYMBOLS

11 Si substrate
12 stacked film

13 Pt film
14 SrTiO₃ film
15 PZT film
15a (001) crystal oriented in a c-axis direction
15b (100) crystal oriented in an a-axis direction
16a c-axis direction
16b a-axis direction
21 SiO₂ film
22 first ZrO₂ film
23 Y₂O₃ film
24 second ZrO₂ film
25 TiO₂ film
26 Ti film
27 second YSZ film
28 first YSZ film
32 stacked film

The invention claimed is:

1. Ferroelectric ceramics comprising:
a Pt film formed on a stacked film;
a SrTiO₃ film formed on said Pt film; and
a PZT film formed on said SrTiO₃ film, wherein,
said stacked film is a film formed by repeating N times sequentially a first ZrO₂ film and a Y₂O₃ film, and a second ZrO₂ film is formed on said film formed repeatedly N times; and
said N is an integer of 1 or more.

2. The ferroelectric ceramics according to claim 1, wherein a ratio of Y/(Zr +Y) of said stacked film is 30% or less.

3. The ferroelectric ceramics according to claim 2, wherein a ratio of Y/(Zr +Y) of said stacked film is 5% or more and 25% or less.

4. The ferroelectric ceramics according to claim 1, wherein said stacked film has a first YSZ film formed between said first ZrO₂ film and said Y₂O₃ film, and a second YSZ film formed between said Y₂O₃ film and said second ZrO₂ film.

5. The ferroelectric ceramics according to claim 1, wherein:
said PZT film has a crystal oriented in a c-axis direction and a crystal oriented in an a-axis direction; and
a length of said a-axis satisfies a formula 1 below, $$0.3975 \text{ nm} < \text{a-axis length} < 0.4002 \text{ nm} \quad \text{formula 1.}$$

6. The ferroelectric ceramics according to claim 1, wherein 2θ of a (004) peak in a result of XRD of said PZT film satisfies a formula 2 below, $$100.8032° < \{2\theta \text{ of } (004) \text{ peak}\} < 101.7489° \quad \text{formula 2.}$$

7. The ferroelectric ceramics according to claim 1, wherein a d value of a (004) peak in a result of XRD of said PZT film satisfies a formula 3 below, $$0.9937 < \{d \text{ value of } (004) \text{ peak}\} < 1.0005 \quad \text{formula 3.}$$

8. The ferroelectric ceramics according to claim 1, wherein a (200) peak intensity and a (111) peak intensity in a result of XRD of said Pt film satisfy a formula 5 below, $$\{\text{Pt (200) peak intensity}\} \geq 100 \cdot \{\text{Pt (111) peak intensity}\} \quad \text{formula 5.}$$

9. The ferroelectric ceramics according to claim 1, wherein a (200) peak intensity and a (111) peak intensity in a result of XRD of said Pt film satisfy a formula 5' below, $$\{\text{Pt (200) peak intensity}\} \geq 50 \cdot \{\text{Pt (111) peak intensity}\} \quad \text{formula 5'.}$$

10. The ferroelectric ceramics according to claim 1, wherein said stacked film is formed on a Si substrate.

11. The ferroelectric ceramics according to claim 1, wherein said stacked film is formed on a Si substrate, and each of said Si substrate, said stacked film and said Pt film is oriented in (100).

12. Ferroelectric ceramics comprising:
an oxide film of a metallic crystal having a body-centered cubic lattice structure formed on a stacked film;
a Pt film formed on said oxide film; and
a PZT film formed on said Pt film, wherein,
said stacked film is a film formed by repeating N times sequentially a first ZrO₂ film and a Y₂O₃ film, and a second ZrO₂ film is formed on said film formed repeatedly N times;
said N is an integer of 1 or more; and
a ratio of Y/(Zr +Y) of said stacked film is 30% or less.

13. The ferroelectric ceramics according to claim 12, wherein a metallic crystal film having a body-centered cubic lattice structure is formed between said oxide film and said Pt film.

14. The ferroelectric ceramics according to claim 12, wherein said metallic crystal having a body-centered cubic lattice structure is a metallic crystal selected from the group consisting of lithium (Li), sodium (Na), potassium (K), titanium (Ti), vanadium (V), chromium (Cr), iron (Fe), rubidium (Rb), niobium (Nb), molybdenum (Mo), cesium (Cs), barium (Ba), tantalum (Ta), tungsten (W) and europium (Eu).

15. The ferroelectric ceramics according to claim 12, wherein said stacked film is formed on a Si substrate, and each of said Si substrate, said stacked film and said Pt film is oriented in (100).

16. The ferroelectric ceramics according to claim 12, wherein said stacked film has a first YSZ film formed between said first ZrO₂ film and said Y₂O₃ film, and a second YSZ film formed between said Y₂O₃ film and said second ZrO₂ film.

17. Ferroelectric ceramics comprising:
an oxide film of a metallic crystal having a body-centered cubic lattice structure formed on a stacked film;
a Pt film formed on said oxide film;
a SrTiO₃ film formed on said Pt film; and
a PZT film formed on said SrTiO₃ film, wherein,
said stacked film is a film formed by repeating N times sequentially a first ZrO₂ film and a Y₂O₃ film, and a second ZrO₂ film is formed on said film formed repeatedly N times;
said N is an integer of 1 or more; and
a ratio of Y/(Zr +Y) of said stacked film is 30% or less.

18. The ferroelectric ceramics according to claim 17, wherein said stacked film has a first YSZ film formed between said first ZrO₂ film and said Y₂O₃ film, and a second YSZ film formed between said Y₂O₃ film and said second ZrO₂ film.

* * * * *